(12) United States Patent
Foltyn et al.

(10) Patent No.: US 7,727,934 B2
(45) Date of Patent: Jun. 1, 2010

(54) ARCHITECTURE FOR COATED CONDUCTORS

(75) Inventors: Stephen R. Foltyn, Los Alamos, NM (US); Paul N. Arendt, Los Alamos, NM (US); Haiyan Wang, Los Alamos, NM (US); Liliana Stan, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 1254 days.

(21) Appl. No.: 11/021,171

(22) Filed: Dec. 23, 2004

(65) Prior Publication Data

US 2006/0142164 A1 Jun. 29, 2006

(51) Int. Cl.
*H01B 12/00* (2006.01)
*H01L 39/00* (2006.01)
*B32B 9/00* (2006.01)

(52) U.S. Cl. .................. 505/238; 505/237; 505/230; 428/698; 428/699; 428/701; 428/702

(58) Field of Classification Search .................. 500/100, 500/230, 434, 437, 704, 708; 29/599; 257/43, 257/190; 428/469, 472, 618, 629; 427/62, 427/126.3
See application file for complete search history.

(56) References Cited

U.S. PATENT DOCUMENTS

| | | | |
|---|---|---|---|
| 5,739,563 A * | 4/1998 | Kawakubo et al. .......... 257/295 |
| 6,190,752 B1 | 2/2001 | Do et al. | |
| 6,537,689 B2 * | 3/2003 | Schoop et al. ............... 428/701 |
| 6,756,139 B2 | 6/2004 | Jia et al. | |
| 6,784,139 B1 * | 8/2004 | Sankar et al. ............... 505/237 |
| 6,933,065 B2 | 8/2005 | Arendt et al. | |
| 2003/0054105 A1 * | 3/2003 | Hammond et al. .......... 427/294 |
| 2003/0144150 A1 * | 7/2003 | Arendt et al. ............... 505/237 |
| 2005/0249869 A1 | 11/2005 | Selvamanickam et al. | |
| 2006/0033160 A1 | 2/2006 | Findikoglu et al. | |

OTHER PUBLICATIONS

Foltyn et al, "Strongly Coupled Critical Current Density Values Achieved in Y1Ba2Cu3O7-d Coated Conductors with Near-Single-Crystal Structure," Applied Physics Letters, 2003, 82(25), pp. 4519-4521.*
Huhne et al., "Thin Biaxially Textured TiN Films on Amorphous Substrates Prepared by Ion-Beam Assisted Pulsed Laser Deposition," Applied Physics Letters, vol. 85, No. 14, pp. 2744-2746, Oct. 4, 2004.
Kim et al., "Growth of YBCO Thin Films on TiN(001) and $CeO_2$-Coated TiN Surfaces," Physica C 377 (2002) 227-234.

* cited by examiner

*Primary Examiner*—Stanley Silverman
*Assistant Examiner*—Kallambella Vijayakumar
(74) *Attorney, Agent, or Firm*—Bruce H. Cottrell

(57) ABSTRACT

Articles are provided including a base substrate having a layer of an oriented cubic oxide material with a rock-salt-like structure layer thereon, and, a layer of epitaxial titanium nitride upon the layer of an oriented cubic oxide material having a rock-salt-like structure. Such articles can further include thin films of high temperature superconductive oxides such as YBCO upon the layer of epitaxial titanium nitride or upon an intermediate buffer layer upon the layer of epitaxial titanium nitride.

19 Claims, No Drawings

US 7,727,934 B2

ARCHITECTURE FOR COATED CONDUCTORS

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to high temperature superconducting thick films on substrates, e.g., polycrystalline substrates, such superconducting thick films having high $J_c$'s and $I_c$'s, and relates to structural template articles for subsequent deposition of an oriented film, e.g., of superconducting thick films.

BACKGROUND OF THE INVENTION

U.S. Pat. No. 6,756,139 described a coated conductor architecture based on IBAD-MgO, which comprises four or five separately deposited layers between the metal substrate and the superconducting layer. Among the described structures are included: (1) a structure including a substrate/a layer of $Al_2O_3$/a layer of $Y_2O_3$/a layer of IBAD-MgO/a homoepitaxial layer of MgO/a layer of $SrRuO_3$/a layer of YBCO; and (2) a structure including a substrate/a layer of $Er_2O_3$/a layer of IBAD-MgO/a homoepitaxial layer of MgO/a layer of $SrRuO_3$/a layer of YBCO.

Excellent critical current density values have been achieved using either of these architectures, but among the various intermediate layers, the homoepitaxial layer of MgO can present the most difficulties. First, the deposition rate is slow, requiring long deposition times and affecting the potential cost of production. Also, this layer is soft and hygroscopic, necessitating special care following deposition to avoid damage that would interfere with subsequent growth of the YBCO layer.

Due to these problems, elimination and/or replacement of this layer has remained a goal of researchers.

Do et al. (U.S. Pat. No. 6,190,752) describe TiN as one exemplary material with a rock salt like structure among other materials including magnesium oxide, such materials suitable as a thin film upon a smooth amorphous surface of a metal alloy substrate.

Kim et al., Physica C, v. 377, pp. 227-234 (2002) describe: (a) a structure of epitaxial TiN on a single-crystal (001) magnesium oxide substrate; and, (b) a structure of epitaxial TiN on a cerium oxide intermediate layer on a single-crystal (001) magnesium oxide substrate. They indicated that the cerium oxide intermediate layer was necessary (comparing (a) and (b)) to avoid a significant drop in $T_c$ and $J_c$ by a subsequently deposited YBCO layer, such YBCO layer deposited at between 700-800° C., on each structure.

Recently, Huhne et al., Appl. Phys. Lett., v. 65, no. 14, pp. 2744-2746 (2004) describe the deposition of TiN films using ion beam assisted deposition on amorphous substrates of $Si/Si_3N_4$ substrates.

Despite the appearance of TiN within various superconducting structures, additional development using TiN as a layer within a superconducting structure has now been explored.

SUMMARY OF THE INVENTION

In accordance with the purposes of the present invention, as embodied and broadly described herein, the present invention provides an article including a base substrate including a layer of an oriented cubic oxide material having a rock-salt-like structure thereon, and, a layer of epitaxial titanium nitride upon the layer of an oriented cubic oxide material having a rock-salt-like structure. In one embodiment, the article of the present invention further includes a layer of a high temperature superconducting material such as YBCO. The base substrate can be a polycrystalline metal and can be a composite base substrate including other layers such as an inert oxide material layer and an oxide or oxynitride material layer on the inert oxide layer.

The present invention further provides a process of forming such articles including a base substrate including a layer of an oriented cubic oxide material having a rock-salt-like structure thereon, and, a layer of epitaxial titanium nitride upon the layer of an oriented cubic oxide material having a rock-salt-like structure, the process including depositing a layer of an oriented cubic oxide material having a rock-salt-like structure upon the base substrate, such deposition preferably using ion beam assisted deposition, and, depositing a layer of epitaxial titanium nitride upon the layer of an oriented cubic oxide material having a rock-salt-like structure.

DETAILED DESCRIPTION

The present invention is concerned with coated conductors, especially coated conductors including an IBAD-MgO layer and YBCO. In particular, the present invention is concerned with the elimination or replacement of any homoepitaxial MgO layer, often deposited onto an IBAD-MgO layer, with a layer of titanium nitride (TiN), preferably an epitaxial layer of TiN.

The term "coated conductor" refers to flexible composite structures including a high temperature superconducting layer.

Titanium nitride has a rock-salt crystal structure (as does MgO) and a very similar lattice constant (4.24 A for TiN compared to 4.21 A for MgO). An advantage offered by TiN, as a replacement layer for any homoepitaxial MgO layer, is that it can be deposited at a higher rate than MgO, thus increasing the speed of production and reducing the potential cost. Also, TiN is not damaged by atmospheric moisture. In addition, TiN is a very hard surface (9 Mohs). These properties make TiN a more robust surface that is less subject to damage by handling or exposure to the atmosphere prior to deposition of subsequent layers. Still another benefit of a TiN layer is the known barrier-layer properties that can reduce diffusion of harmful elements from the substrate into the superconductive layer. This can help maintain better superconductive properties such as high superconducting transition temperatures.

In the present invention, the high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium, may also be used. A mixture of the rare earth metal europium with yttrium may be one preferred combination. Other superconducting materials such as bismuth and thallium based superconductor materials may also be employed. $YBa_2Cu_3O_{7-\delta}$ is generally preferred as the superconducting material. YBCO typically has a superconducting transition temperature of about 87K and such a temperature is presently generally considered as a high temperature for superconductive materials as it allows the use of liquid nitrogen as the coolant.

Addition of selected particulate materials to the high temperature superconducting material can enhance flux pinning properties. Such particulate materials can be of barium zirconate, yttrium barium zirconate, yttrium oxide and the like. The particulates are preferably sizes from about 5 nanometers to about 100 nanometers in major dimension and are generally present in amounts of from about 1 to about 20 weight percent.

In one embodiment of the present invention, an article is provided including a base substrate, an intermediate layer of an oriented cubic oxide material having a rock-salt-like structure, and a layer of epitaxial titanium nitride upon the layer of an oriented cubic oxide material having a rock-salt-like structure. One or more structural layers can be placed between the base substrate and the layer of an oriented cubic oxide material having a rock-salt-like structure. Such structural layers can include a layer of an inert material such as aluminum oxide ($Al_2O_3$) and the like upon the base substrate and a layer of an oxide or oxynitride material such as $Y_2O_3$, AlON and the like on the layer of an inert material, thus forming a composite base substrate. Upon such a composite base substrate can be deposited the layer of an oriented cubic oxide material having a rock-salt-like structure. Preferably, the layer of an oriented cubic oxide material having a rock-salt-like structure is deposited by ion beam assisted deposition as is now commonly referred to as IBAD. In other embodiments, the article can additionally include a buffer layer on the layer of epitaxial titanium nitride, and can include a layer of a high temperature superconducting material directly on the layer of epitaxial titanium nitride or directly on the buffer layer upon the layer of epitaxial titanium nitride.

Suitable buffer layers that can be used upon the layer of epitaxial titanium nitride can include strontium titanate, strontium ruthenate, mixtures of strontium titanate and strontium rutheante, lanthanum manganate, hafnium oxide, hafnium oxide with a secondary oxide such as cerium oxide, yttrium oxide, lanthanum oxide, scandium oxide, calcium oxide, magnesium oxide and the like.

High temperature superconducting (HTS) layers, e.g., a YBCO layer, can be deposited, e.g., by pulsed laser deposition or by methods such as evaporation including e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 1 millimeter (mm) by 4 mm with an average energy density of from about 1 to 4 joules per square centimeter ($J/cm^2$). After deposition, the films generally are cooled within an oxygen atmosphere of greater than about 100 Torr to room temperature.

The thin films of high temperature superconducting materials are generally from about 0.2 microns to about 10 microns in thickness, more preferably in the range of from about 1.5 μm to about 5 μm.

In the present invention, the high temperature superconducting material can be upon any suitable base substrate. For coated conductors of a high temperature superconducting material such as YBCO, the base substrate can be, e.g., a polycrystalline material such as polycrystalline metals or polycrystalline ceramics or can be a single crystal base substrate such as lanthanum aluminum oxide, aluminum oxide, magnesium oxide and the like. Also, the initial or base substrate can be an amorphous substrate such as silica or glass. In one embodiment, the base substrate can be a polycrystalline metal such as a metal alloy. Nickel-based alloys such as various Hastelloy metals, Haynes metals and Inconel metals are useful as the base substrate. Iron-based substrates such as steels and stainless steels may be used as the base substrate. Copper-based substrates such as copper-beryllium alloys may also be useful as the base substrate. In one embodiment, the base substrate can be a polycrystalline ceramic such as polycrystalline aluminum oxide, polycrystalline yttria-stabilized zirconia (YSZ), forsterite, yttrium-iron-garnet (YIG), silica and the like.

The ultimate application can determine the selection of the material for the base substrate. For example, the selection of the base substrate on which subsequent superconducting material (e.g., YBCO) is deposited can allow for the resultant article to be flexible whereby superconducting articles (e.g., coils, motors or magnets) can be shaped. Thus, for superconducting applications requiring flexible substrates, the base substrate is generally a polycrystalline metal as these materials are usually flexible, i.e., they can be shaped. For other applications, the base substrate on which other oriented materials are deposited may be polycrystalline ceramics, either flexible or non-flexible. For still other applications, the base substrate may be a single crystal substrate such as magnesium oxide, lanthanum aluminate, or aluminum oxide.

The present invention is more particularly described in the following examples that are intended as illustrative only, since numerous modifications and variations will be apparent to those skilled in the art.

Example 1

A series of tests were initially conducted to determine the barrier properties of the various layers in a standard architecture of: substrate/a layer of $Al_2O_3$/a layer of $Y_2O_3$/a layer of IBAD-MgO/a homoepitaxial layer of MgO/a layer of $SrTiO_3$/a layer of YBCO Preliminary results indicated that both the $Al_2O_3$ layer and the $SrTiO_3$ layer were necessary in order for the YBCO layer to have a superconducting transition temperature above 75K.

Then, a first architecture for a coated conductor in accordance with the present invention was formed with the following structure: a substrate/a layer of $Al_2O_3$/a layer of $Y_2O_3$/a layer of IBAD-MgO/a layer of epitaxial TiN/a layer of $SrTiO_3$/a layer of YBCO (1.65 microns). From this structure, the measured properties of the YBCO layer was: an in-plane texture of 2.2 degrees FWHM, a superconducting transition temperature ($T_c$) of 88.0 K, and a critical current density ($J_c$) of 2.0 megamperes ($MA/cm^2$). This $J_c$ measurement is remarkably high demonstrating that the TiN can be substituted for the current standard homoepitaxial MgO layer to yield excellent results.

A second architecture for a coated conductor was formed with the following structure: a substrate/a layer of $Al_2O_3$/a layer of $Y_2O_3$/a layer of IBAD-MgO/a layer of epitaxial TiN/a layer of YBCO. The deposited layers of epitaxial TiN were very thin (about 35 nanometers). From this structure, the measured properties of the YBCO layer was: a superconducting transition temperature ($T_c$) of 87.2 K, and a critical current density ($J_c$) of 0.7 $MA/cm^2$. While these results are not as high as current state of the art measurements, they do demonstrate that the barrier properties of TiN are comparable to those of $SrTiO_3$ or $SrRuO_3$. Additionally, they demonstrate that high quality YBCO can be deposited directly upon a TiN layer.

Although the present invention has been described with reference to specific details, it is not intended that such details should be regarded as limitations upon the scope of the invention, except as and to the extent that they are included in the accompanying claims.

What is claimed is:

1. An article comprising:
    a base substrate of a flexible polycrystalline metal including a layer of an oriented cubic oxide material having a rock-salt-like structure layer thereon; and,
    a layer of epitaxial titanium nitride upon the layer of an oriented cubic oxide material having a rock-salt-like structure.

2. The article of claim 1 wherein the layer of an oriented cubic oxide material having a rock-salt-like structure is of magnesium oxide.

3. The article of claim 1 wherein the layer of an oriented cubic oxide material having a rock-salt-like structure is deposited by ion beam assisted deposition.

4. The article of claim 3 wherein the layer of an oriented cubic oxide material having a rock-salt-like structure is of magnesium oxide.

5. The article of claim 1 wherein the layer of epitaxial titanium nitride has a thickness of from about 10 nanometers to about 100 nanometers.

6. The article of claim 1 wherein the base substrate further includes an inert oxide material layer between the base substrate and the layer of an oriented cubic oxide material having a rock-salt-like structure.

7. The article of claim 1 wherein the base substrate further includes an inert oxide material layer selected from the group consisting of aluminum oxide, erbium oxide, and yttrium oxide on the base substrate, and a layer of an oxide or oxynitride material upon the inert oxide material layer and the layer of an oriented cubic oxide material having a rock-salt-like structure is upon the layer of an oxide or oxynitride material.

8. The article of claim 6 wherein the inert oxide material layer is selected from the group consisting of aluminum oxide, erbium oxide, and yttrium oxide.

9. The article of claim 7 wherein the oxide or oxynitride material layer is selected from the group consisting of yttrium oxide, aluminum oxynitride, erbium oxide, yttria-stabilized zirconia, cerium oxide and europium oxide.

10. The article of claim 1 further including a layer of a buffer material upon the epitaxial layer of titanium nitride.

11. The article of claim 10 wherein said buffer material is selected from the group consisting of strontium ruthenate, strontium titanate, mixtures of strontium ruthenate and strontium titanate, and lanthanum manganate.

12. The article of claim 1 further including a layer of a high temperature superconductive oxide material upon the epitaxial layer of titanium nitride.

13. The article of claim 12 wherein the high temperature superconductive oxide material is a yttrium barium copper oxide (YBCO).

14. The article of claim 11 further including a layer of a high temperature superconductive oxide material upon the layer of buffer material.

15. The article of claim 14 wherein the high temperature superconductive oxide material is a yttrium barium copper oxide (YBCO).

16. The article of claim 13 wherein the layer of a yttrium barium copper oxide includes flux pinning particulates therein.

17. The article of claim 16 wherein the flux pinning particulates are of barium zirconate.

18. The article of claim 15 wherein the layer of a yttrium barium copper oxide includes flux pinning particulates therein.

19. The article of claim 18 wherein the flux pinning particulates are of barium zirconate.

* * * * *